(12) United States Patent
Buynoski

(10) Patent No.: US 6,246,118 B1
(45) Date of Patent: *Jun. 12, 2001

(54) LOW DIELECTRIC SEMICONDUCTOR DEVICE WITH RIGID, CONDUCTIVELY LINED INTERCONNECTION SYSTEM

(75) Inventor: Matthew S. Buynoski, Palo Alto, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/252,185

(22) Filed: Feb. 18, 1999

(51) Int. Cl.[7] .................................................. H01L 23/48
(52) U.S. Cl. .......................................... 257/758; 257/776
(58) Field of Search ...................... 25/758, 776, 768–770

(56) References Cited

U.S. PATENT DOCUMENTS

| | | | |
|---|---|---|---|
| 3,890,636 | * 6/1975 | Harada et al. | 257/776 |
| 4,954,214 | * 9/1990 | Ho | 156/628 |
| 5,004,700 | * 4/1991 | Webb et al. | 437/42 |
| 5,117,276 | * 5/1992 | Thomas et al. | 357/71 |
| 5,292,558 | * 3/1994 | Heller et al. | 427/533 |
| 5,413,962 | 5/1995 | Lur et al. . | |
| 5,708,303 | 1/1998 | Jeng . | |
| 5,798,559 | * 8/1998 | Bothra et al. | 257/522 |
| 5,882,963 | * 3/1999 | Kerber et al. | 438/195 |
| 5,953,626 | * 9/1999 | Hause et al. | 438/622 |
| 6,037,248 | * 3/2000 | Ahn | 438/619 |
| 6,078,088 | * 6/2000 | Buynoski | 257/410 |
| 6,091,149 | * 7/2000 | Hause et al. | 257/758 |

FOREIGN PATENT DOCUMENTS 2 247 986    3/1992    (GB) .

* cited by examiner

Primary Examiner—Tom Thomas
Assistant Examiner—Ori Nadav

(57) ABSTRACT

Multi-level semiconductor devices are formed with reduced parasitic capacitance without sacrificing structural integrity or electromigration performance by removing the inter-layer dielectrics and supporting the interconnection system with a rigid, conductive lining, such as, a hard metal, e.g., W, Mo, Os, Ir or alloys thereof. Embodiments include depositing a dielectric sealing layer, e.g., silicon nitride, before forming the first metallization level, removing the inter-layer dielectrics after forming the last metallization level, electroplating or electroless plating the hard metal to line the interconnection system and forming dielectric protective layers, e.g., a silane derived oxide bottommost protective layer, on the uppermost metallization level.

27 Claims, 4 Drawing Sheets

LOW DIELECTRIC SEMICONDUCTOR DEVICE WITH RIGID, CONDUCTIVELY LINED INTERCONNECTION SYSTEM

RELATED APPLICATIONS

This application contains subject matter similar to subject matter disclosed in Copending U.S. patent application Ser. No. 09/225,541, filed Jan. 5, 1999; Ser. No. 09/252,186 filed on Feb. 18, 1999; Ser. No. 09/252,184 filed on Feb. 18, 1999; and Ser. No. 09/252,183 filed Feb. 18, 1999.

TECHNICAL FIELD

The present invention relates to a semiconductor device with reduced capacitance loading, and to a method of manufacturing the semiconductor device. The invention has particular applicability in manufacturing high density, multi-level semiconductor devices comprising submicron dimensions.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly submicron vias, contacts and trenches have high aspect ratios due to miniaturization.

Conventional semiconductor devices typically comprise a semiconductor substrate typically undoped monocrystalline silicon, and a plurality of sequentially formed inter-layer dielectrics and patterned metal layers. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink into the deep submicron range.

A conductive plug filling a via opening is typically formed by depositing an inter-layer dielectric on a patterned conductive (metal) layer comprising at least one metal feature, forming an opening in the inter-layer dielectric by conventional photolithographic and etching techniques, and filling the opening with a conductive material, such as tungsten (W). Excess conductive material on the surface of the inter-layer dielectric is removed by chemical-mechanical polishing (CMP). One such method is known as damascene and basically involves the formation of an opening which is filled in with a metal. Duel damascene techniques involve the formation of an opening comprising a lower contact or via opening section in communication with an upper trench opening section, which opening is filled with a conductive material, typically a metal, to simultaneously form a conductive plug in electrical contact with a conductive line.

High performance microprocessor applications require rapid speed of semiconductor circuitry. The speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional area and distance between interconnects decrease, the RC delay caused by the interconnect wiring increases. If the interconnection node is routed over a considerable distance, e.g., hundreds of microns or more, as in submicron technologies, the interconnection capacitance limits the circuit node capacitance loading and, hence, the circuit speed. As design rules are reduced to about 0.18 micron and below, the rejection rate due to integrated circuit speed delays severely limits production throughput and significantly increases manufacturing costs. Moreover, as line widths decrease, electrical conductivity and electromigration resistance become increasingly important.

As device geometries shrink and functional density increase, it becomes increasingly imperative to reduce the capacitance between metal lines. Line-to-line capacitance can build up to a point where delay time and cross talk may hinder device performance. Reducing the capacitance within multi-level metallization systems will reduce the RC constant, cross talk voltage, and power dissipation between the lines.

One way to increase the speed of semiconductor circuitry is to reduce the resistance of a conductive pattern. Conventional metallization patterns are typically formed by depositing a layer of conductive material, notable aluminum or an alloy thereof, and etching, or by damascene techniques wherein trenches are formed in dielectric layers and filled with conductive material. The use of metals having a lower resistivity than aluminum, such as copper, engenders various problems which limit their utility. For example, copper readily diffuses through silicon dioxide, the typical dielectric material employed in the manufacture of semiconductor devices, and adversely affects the devices. In addition, copper does not form a passivation film, as does aluminum. Hence, a separate passivation layer is required to protect copper from corrosion.

The dielectric constant of materials currently employed in the manufacture of semiconductor devices for an inter-layer dielectrics (ILD) spans from about 3.9 for dense silicon dioxide to over 8 for deposited silicon nitride. Prior attempts have been made to reduce the interconnect capacitance and, hence, increase the integrated circuit speed, by developing dielectric materials having a lower dielectric constant than that of silicon dioxide. New materials having low dielectric constants, such as low dielectric constant polymers, teflon and porous polymers have been developed. There has been some use of certain polyimide materials for ILDs which have a dielectric constant slightly below 3.0.

Recent attempts have also resulted in the use of low-density materials, such as an aerogel, which has a lower dielectric constant than dense silicon oxide. The dielectrical constant of a porous silicon dioxide, such as an aerogel, can be as low as 1.2, thereby potentially enabling a reduction in the RC delay time. However, conventional practices for producing an aeorgel require a supercritical drying step, which increase the cost and degree of complexity for semiconductor manufacturing. Moreover, the use of an aerogel results in a semiconductor device which lacks sufficient structural integrity.

Prior attempts to reduce parasitic RC time delays also include the formation of various types of air gaps or bridges.

See, for example, Lur et al., U.S. Pat. No. 5,413,962, Jeng, U.S. Pat. No. 5,708,303 and Saul et al., UK Patent GB2, 247,986A. However, the removal of ILD material becomes problematic in various respects. Firstly, the removal of ILD material adversely impacts the structural integrity of the resulting semiconductor device rendering it unduly fragile. Secondly, the removal of ILD material results in a significant reduction in electromigration resistance of the conductors due to exposed free surfaces.

Accordingly, there exists a need for a semiconductor device having reduced parasitic RC time delays with reduced internal capacitance without sacrificing structural integrity and/or electromigration performance.

DISCLOSURE OF THE INVENTION

An advantage of the present invention is a semiconductor device exhibiting reduced parasitic RC time delays without sacrifice of structural integrity and/or electromigration performance.

Another advantage of the present invention is a method of manufacturing a semiconductor device exhibiting reduced parasitic RC time delays without sacrifice of structural integrity and/or electromigration performance.

Additional advantages and other features of the present invention will be set forth in the description which follows and in part will be apparent to those having ordinary skill in the art upon examination of the following or may be learned from the practice of the present invention. The advantages of the present invention may be realized and obtained as particulary pointed out in the appended claims.

According to the present invention, the foregoing and the advantages are achieved in part by a semiconductor device comprising a substrate having active regions; and an interconnection system comprising: a first patterned metal layer, comprising metal features, over the substrate; a plurality of patterned metal layers, each patterned metal layer containing metal features, over the first patterned metal layer terminating with an uppermost patterned metal layer; vias electrically connecting metal features of different patterned metal layers; contacts electrically connecting active regions to metal features of the first patterned metal layer; air gaps between the patterned metal layers, metal features, and vias; and a conductive liner, comprising a material different from the metal features, on the metal features and vias.

Another aspect of the present invention is a method of manufacturing a semiconductive device, the method comprising: forming a substrate with active regions; forming an interconnection system comprising: a first patterned metal layer, over the substrate, having metal features electrically connected to active regions by contacts; a plurality of patterned metal layers over the first patterned metal layer terminating with an uppermost patterned metal layer, each patterned metal layer having metal features electrically connected to metal features of different patterned metal layers by vias; and an inter-layer dielectric between patterned metal layers; removing the inter-layer dielectrics; and forming a conductive liner, comprising a material different from the patterned metal layers, on the metal features and vias.

Embodiments of the present invention include forming a dielectric sealing layer on the semiconductor substrate below the first patterned metal layer, and forming dielectric protective layers on the uppermost metal layer. Embodiments of the present invention also include selectively depositing, as by electroplating or electroless plating, a hard metal, such as tungsten (W), molybdenum (M0), osmium (Os), iridium (Ir) or an alloy thereoff to form the rigid conductive line on the surfaces of the metal features and vias. Embodiments of the present invention further include employing a lead-rich glass, a benzocyclobutene (BCB) resin or low temperature silica as the ILD material, and employing silicon nitride or a composite of a hydrophobic layer on silicon nitride as the dielectric sealing layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various respects, all without departing from the present invention. Accordingly, the drawings and description are to be regarded as illustrative in nature, and not as restrictive.

DESCRIPTION OF THE INVENTION

Figure 1:
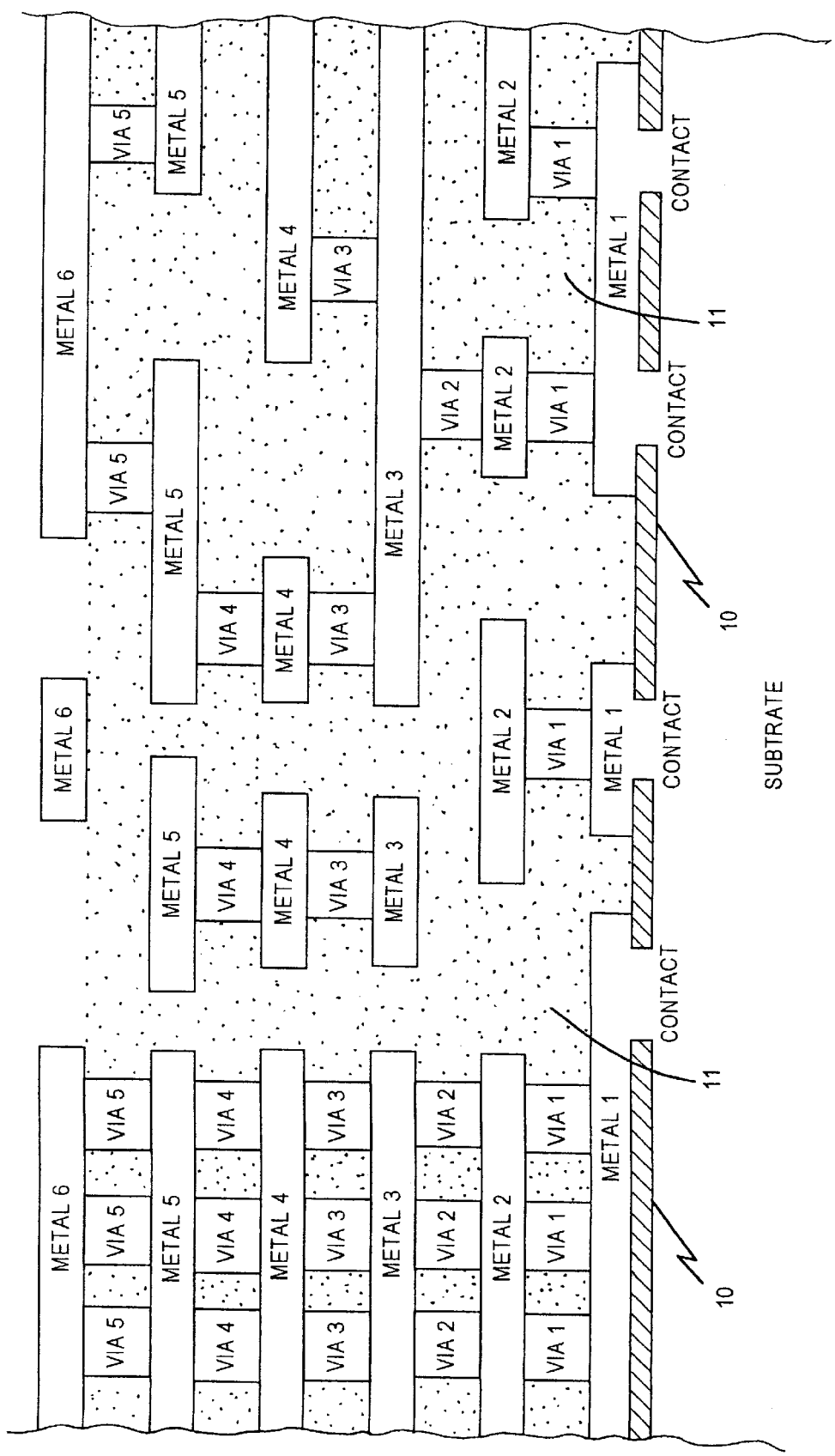
FIGS. 1–4 represent sequential phases of a method in accordance with an embodiment of the present invention, wherein like elements are denoted by like reference numerals.

The present invention addresses and solves problems attendant upon conventional multi-layer interconnection devices, particularly parasitic RC time delays. The capacitance, both layer-to-layer and within -layer, is primarily attributed to the film properties of the ILD. Prior attempts to remove ILDs by creating air tunnels or air gaps create significant structural integrity problems and result in a significant lose of electromigration resistance due to the exposed free surfaces of the conductors. The present invention enables the manufacture of semiconductor devices with a signifcantly reduced parasitic RC time delay by reducing both layered-to-layer and within -layer capacitance without adversely impacting structural integrity and without lowering electromigration resistance. Embodiments of the present invention comprise removing the ILDs and providing a conductive, stiffing liner on the surfaces of the interconnection system, e.g., metal lines and vias. The resulting stiffened, conductively lined interconnection system comprises air gaps between the patterned metal layers, metal features and vias. The air gaps are, desirably, substantially continuous throughout the interconnection system and substantially reduce the capacitance of the interconnection system. The rigid, conductive enhances the structural integrity of the resulting semiconductor device and prevents a reduction in electromigration performance by encapsulating the exposed surfaces of the interconnection system.

Embodiments of the present invention comprises selectively depositing a relatively hard metal to serve as the rigid, conductive liner on the surfaces of the metal features and vias. Suitable heavy metals include W, Mo, Os, Ir and alloys thereof. Such heavy metals can be selectively deposited by electroplating or electroless plating. In embodiments of the present invention, the heavy metal is pulse electroplate under conditions such that the overall plating rate is essentially surface-retention limited. This can be implemented by a series of pulse electroplating stages with non-plating periods during which the plating species diffuses to the exposed surfaces of the metal features and vias. For example, W, Mo, Os, Ir or an alloy thereof is suitably pulse electroplated with non-plating diffusion periods of about 10 to about 60 seconds until a rigid, protective, conductive lining is formed enveloping the interconnection system. Electroplating and electroless plating advantageously enables penetration of the plating metal into highly convoluted narrow passages characteristic of multi-level interconnection systems, such that the interconnection system is substantially continuously enveloped by the rigid, conductive metal lining.

Pulse electroplating is generally employed in metal finishing industries and comprises, in its simplest sense, metal deposition by pulse electrolysis, as by interrupted DC current, to electroplate parts. That is effected with a series of pulses of DC current of equal amplitude and duration in the same direction, separated by periods of zero current. The pulse rate (frequency) and ON and OFF intervals x (duty cycle) are controllable to optimize electroplating in a particular situation. Pulse electroplating can be conducted by utilizing a constant current or with constant voltage pulses. In employing pulse electroplating in accordance with the present invention, the relevant variables, such as the duty cycle, frequency and current density in a particular situation, can be optimized in a particular situation given the disclosed objectives.

Embodiments of the present invention comprise depositing a sealing layer either just above the local interconnect or first contact layer in the process sequence, e.g., on the semiconductor substrate below the first metallization layer. The sealing layer is ideally selected such that it is impermeable to the ILD removal technique employed. It is particulary suitable to form a sealing layer which rejects deposition of the subsequent conductive lining material. Suitable materials for the sealing layer include silicon nitride, particulary where electroplating a heavy metal, since silicon nitride is non-conductive and prevents electrochemical reactions. Additional protection from electroplated metal spreading out from contact areas across the sealing layer surface is achieved by depositing a hydrophobic material on the silicon nitride layer. Suitable hydrophobic materials include fluorpolymers, such as aryl ethers, e.g., "FLARE" available from Allied Signal Corporation, located in Sunnyvale, Calif.

Virtually any removable dielectric material can be employed in forming the ILDs in accordance with the present invention. It is desirable, however, to select dielectric materials which can be readily, e.g., dissolved, with damage to the metal conductors and which, themselves, will not be damaged or destroyed by conventional processing conditions, such as photoresist removal and metal etching. It has been found suitable to employ, as an ILD material, a lead-rich glass capable of being dissolved in acetic acid. Other suitable materials for the ILDs include a benzocyclobutene (BCB)-type resin which is stable with respect to an oxygen-containing plasma conventionally employed to remove photoresist material, but capable of being removed by exposure to a mixed oxygen-fluorine plasma. Another suitable material for the ILDs is a very soft, low density, silica deposited at a relatively low temperature and capable of being removed with a non-acidic or weakly acidic buffered hydrofluoric acid. The latter, relatively porous silica is compatable with current manufacturing capabilities in that virtually no contamination is introduced.

Embodiments of the present invention also include depositing protective or passivation layers after depositing the liner on the conductors of the interconnection system. The protective or passivation layers are deposited above the uppermost patterned metal layer and serve as final protection against environmental contaminants. Penetration of the protective layers into the air gaps can be prevented by overlapping the features of the uppermost patterned metal layer with the features of the immediately underlying patterned metal layer. Another alternative comprises forming narrow gaps between the features of the uppermost patterned metal layer to prevent protective layer penetration. The protective layers include a bottommost protective layer having a thickness of about 5,000 Å to about 15,000 Å, e.g., about 8,000 Å to about 10,000 Å. Suitable materials for use as the bottommost dielectric protective layer include atmospheric pressure silane-base oxide depositions. A silicon nitride or silicon oxynitride layer is then depositied on the bottommost protective layer.

An embodiment of the present invention is schematically illustrated in FIGS. 1–4. Referring to FIG. 1 there is schematically illustrated a substrate, the active regions omitted for illustrative clarity. Contacts to active regions are identified. A dielectric sealing layer 10 is formed on the substrate and the first patterned metal layer (Metal 1) formed thereon. Dielectric sealing layer can be formed at a thickness of about 300 Å to about 1,000 Å. A hydrophobic layer 10A can be formed on layer 10. The illustrated device comprises six patterned material layers (identified as Metal 1–Metal 6) with five levels of conductive vias (identified as Via 1–Via 5) electrically interconnecting features on spaced apart patterned metal layers. The ILDs comprise dielectric material 11, such as a silica aerogel, which appears as throughout the interconnection structure.

Figure 2:
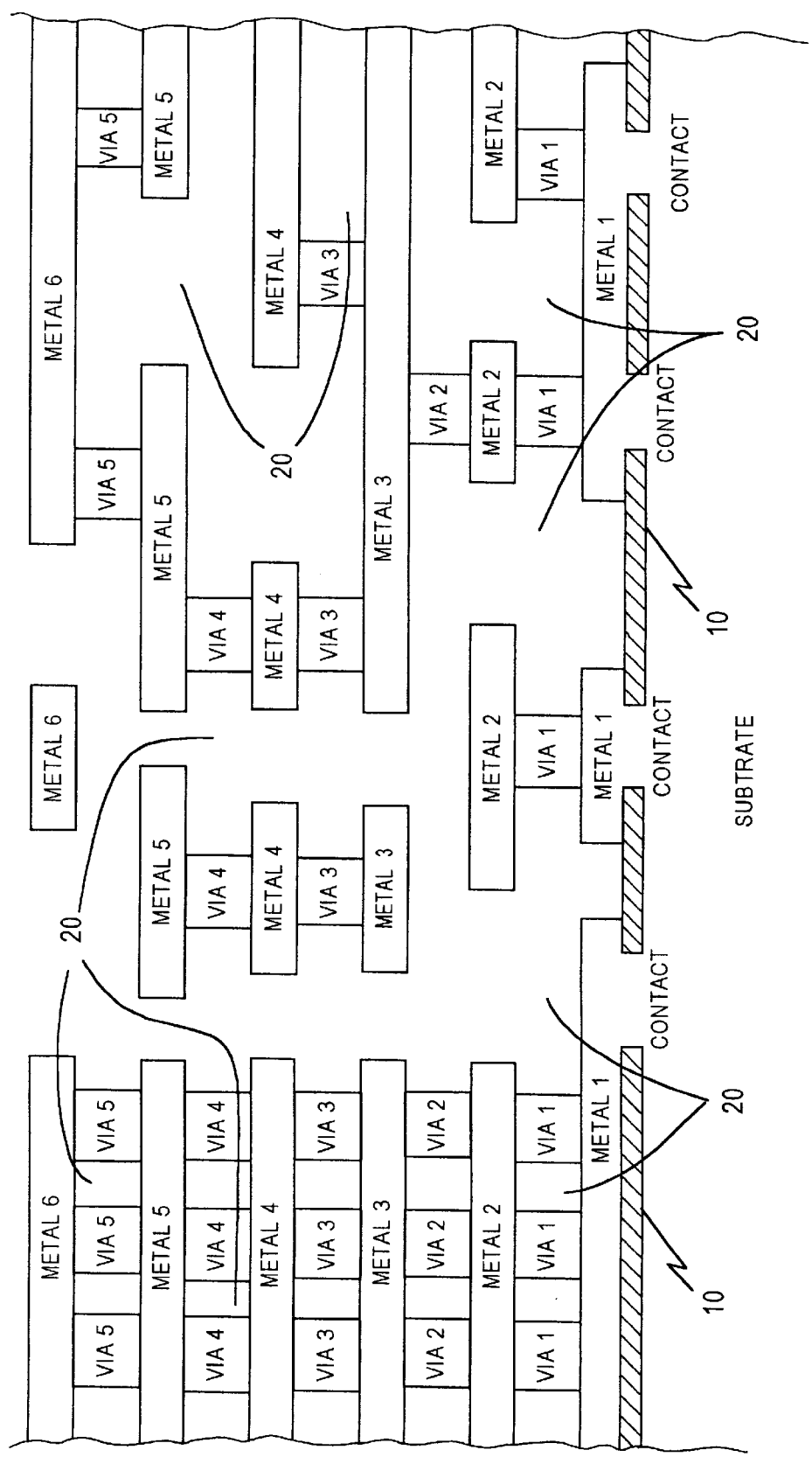

As shown in FIG. 2, the dielectric material 11 is removed, as with a slightly acidic buffered hydrofluoric acid solution, thereby creating voids or air gaps 20 throughout the interconnection structure. The formation of air gaps 20 significantly reduces the capacitance of the entire interconnection system as the dielectric constant of air is taken as one.

Figure 3:
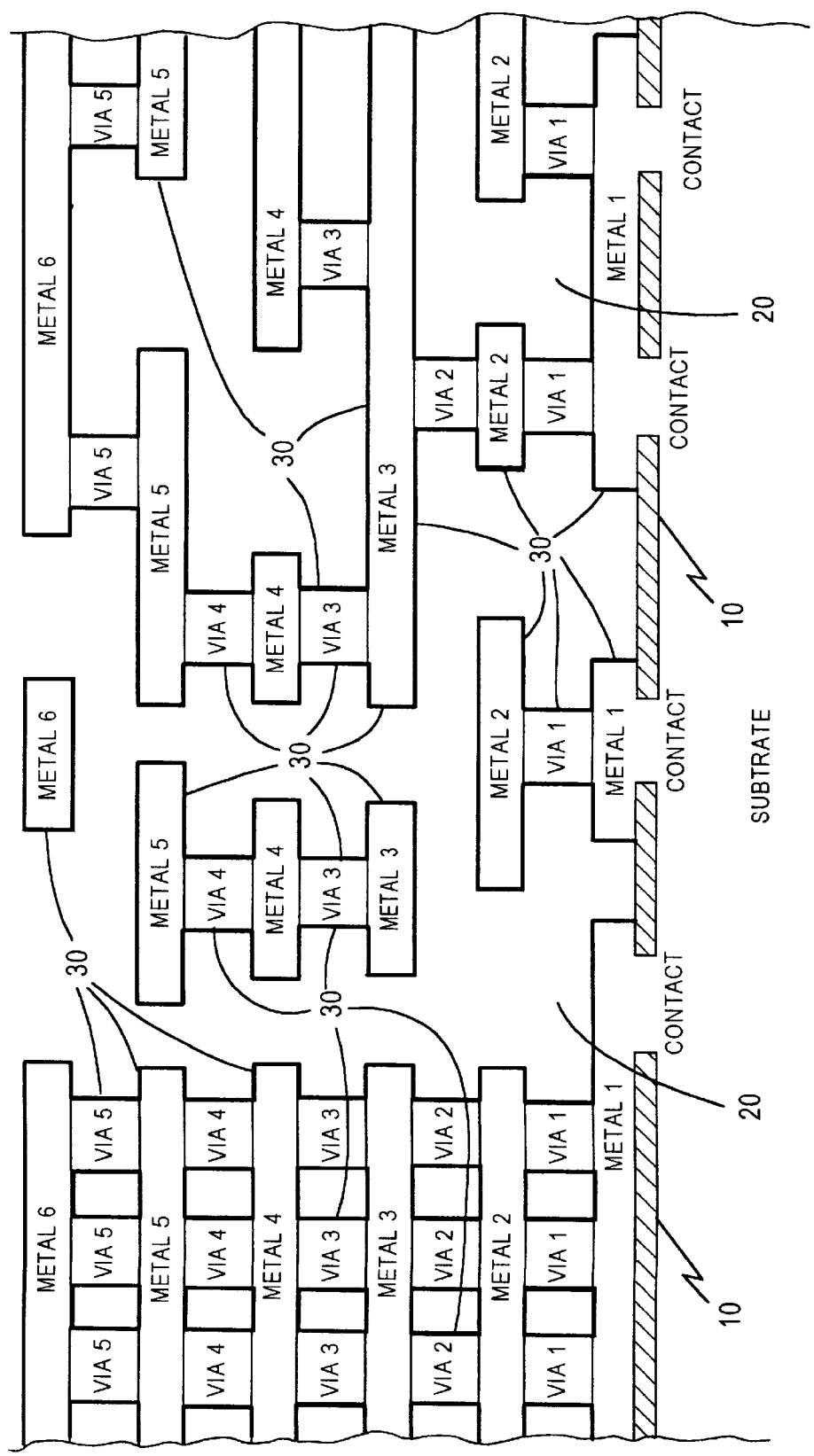
Figure 4:
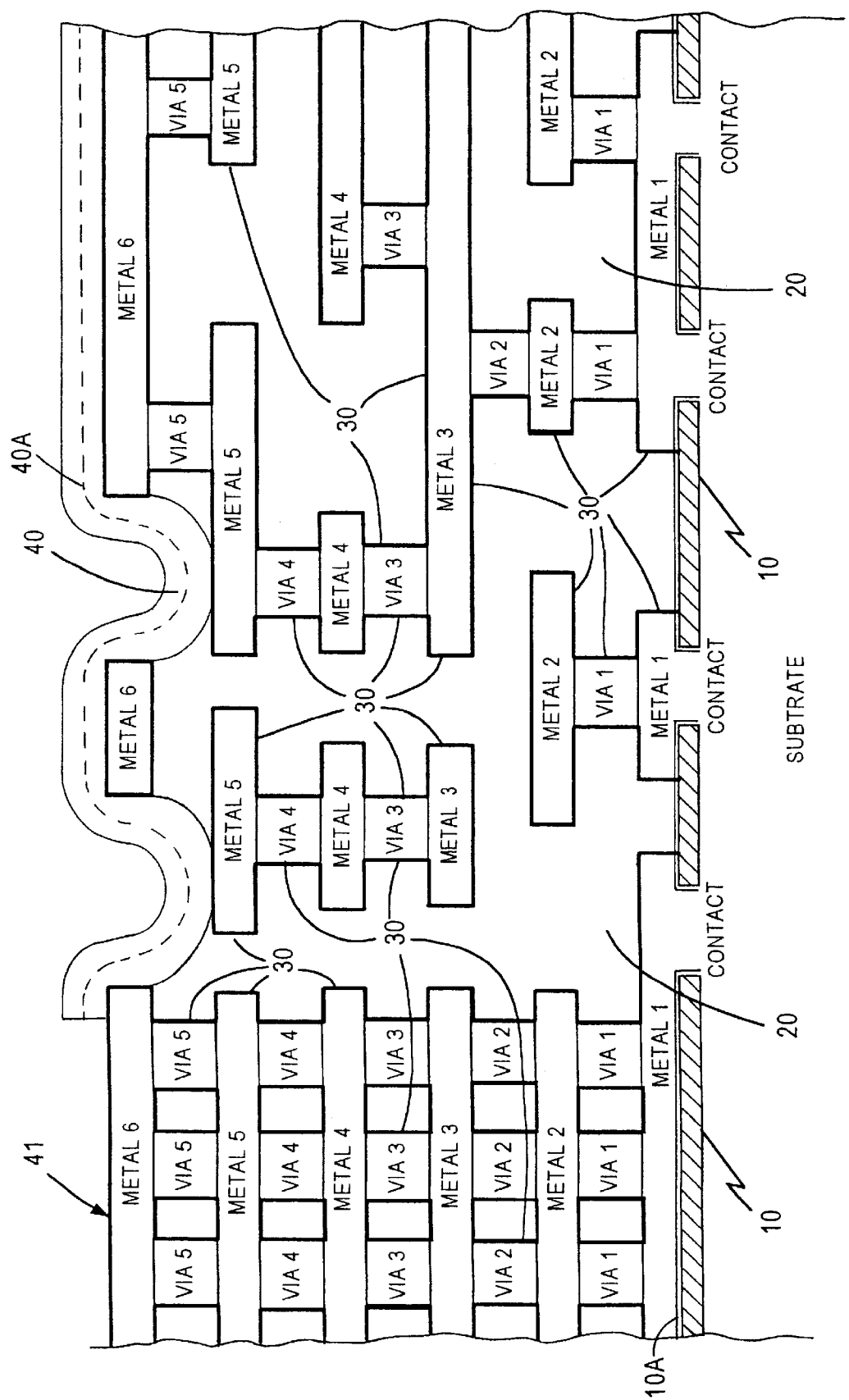

As shown in FIG. 3, a liner 30, e.g., a heavy metal, e.g., W, Mo, Os, Ir or an alloy thereof, is applied to the interconnection system by a plurality of pulse electroplating stages with intermittent diffusion non-electroplating periods to substantially envelope the metal features and vias. Conductive line 30 provides structural rigidity to the entire interconnection system while preventing a decrease in electromigration resistance of the interconnection components. Subsequentially, as shown in FIG. 4, dielectric protective or passivation layers 40A are deposited to protect the device form environmental contaminants. Reference numeral 41 denotes the bonding pad area which is not covered by dielectric protective layers 40A.

The present invention provides efficient, cost effective methodology for manufacturing highly integrated semiconductive devices exhibiting increased circuit speed by significantly reducing the capacitance of the interconnection system without adversely impacting structural integrity or electromigration performance. The present invention includes the use of various metals for the interconnection system, such as aluminum, aluminum alloys, copper, copper alloys, as well as tungsten plugs in forming vias. Patterned metal layers can be formed in any conventional manner, as by blanket deposition and etch back techniques or damascene techniques, including single and dual damascene techniques.

The present invention is industrially applicable to the manufacture of any of various type of semiconductor device. The present invention enjoys particular applicable in manufacturing highly integrated, multi-level semiconductor devices having submicron features, e.g. a design rule of less than about 0.18 micron.

Only the preferred embodiment of the present invention and but a few examples of its versatility are shown and described in the present disclosure. It is to be understood that the present invention is capable of using various other combinations and environments and is capable of changes or modifications within the scope of the inventiion concept as expressed herein.

What is claimed is:

1. A semiconductor device comprising:
    a substrate having active regions; and
    an interconnection system comprising:
        a first patterned metal layer, comprising metal features, over the substrate;
        a plurality of patterned metal layers, each patterned metal layer containing metal features, above the first patterned metal layer terminating with an uppermost patterned metal layer;
        vias electrically connecting metal features of different patterned metal layers;
        contact electrically connecting active regions to metal features of the first patterned metal layer;
        air gaps, substantially continuous throughout the interconnection system, between the patterned metal layers, metal features, and vias; and
        a conductive liner, comprising a material different from the metal features, directly on the metal features and vias, wherein the conductive liner substantially envelops all the metal features and vias.

2. The semiconductor device according to claim 1, further comprising a dielectric sealing layer between the substrate and first patterned metal layer.

3. The semiconductor device according to claim 2, further comprising dielectricc protective layers on the uppermost patterned metal layer.

4. The semiconductor device according to claim 3, wherein the conductive liner comprises a metal.

5. A semiconductor device comprising:
    a substrate having active regions; and
    an interconnection system comprising:
        a first patterned metal layer, comprising metal features, over the substrate;
        a plurality of patterned metal layers, each patterned metal layer containing metal features, above the first patterned metal layer terminating with an uppermost patterned metal layer;
        vias electrically connecting metal features of different patterned metal layers;
        contact electrically connecting active regions to metal features of the first patterned metal layer;
        air gaps, substantially continuous throughout the interconnection system, between the patterned metal layers, metal features, and vias; and
        a conductive liner, comprising a material different from the metal features, directly on the metal features and vias, wherein the conductive liner substantially envelops all the metal features and vias, and wherein the conductive liner comprises tungsten, molybdenum, osmium, iridium or an alloy thereof.

6. The semiconductor device according to claim 4, wherein the metal liner has a thickness of about 500 Å to about 1,000 Å.

7. The semiconductor device according to claim 5, wherein the dielectric sealing layer comprises silicon nitride, or composite of a hydrophobic material on silicon nitride.

8. The semiconductor device according to claim 7, wherein the dielectric sealing layer has a thickness of about 500 Å to about 1,000 Å.

9. The semiconductor device according to claim 7, wherein the dielectric protective layers comprise a bottommost protective layer of an oxide.

10. The semiconductor device according to claim 9, wherein the bottommost protective oxide layer has a thickness of about 5,000 Å to about 15,000 Å.

11. The semiconductor device according to claim 5, wherein the conductive liner consists essentially of tungsten, molybdenum, osmium, iridium or an alloy thereof.

12. The semiconductor device according to claim 1, wherein the conductive liner enhances the structural integrity of the semiconductor device and prevents a reduction in electromigration resistance.

13. The semiconductor device according to claim 2, wherein the dielectric sealing layer is a composite comprising a first layer and a second layer of a hydrophilic material on the first layer.

14. The semiconductor device according to claim 13, wherein the first layer comprises silicon nitride.

15. The semiconductor device according to claim 14, wherein the second layer comprise a fluoropolymer.

16. The semiconductor device according to claim 5, wherein the conductive liner comprises osmium, indium or an alloy thereof.

17. The method according to claim 16, wherein the patterned metal layer comprises aluminum, copper or an alloy thereof.

18. A method of manufacturing a semiconductor device, the method comprising:
    forming a substrate with active regions;
    forming an interconnection system comprising:
        a first patterned metal layer comprising metal features over the substrate,
        a plurality of patterned metal layers each of which containing metal features, above the first patterned metal layer terminating with an uppermost patterned metal layer;
        vias electrically connecting metal features of different patterned metal layers;
        contact electrically connecting active regions to metal features of the first patterned metal layer; and an inter-layer dielectric between the patterned metal layers,
    removing the inter-layer dielectric, and having air gaps substantially continuous throughout the interconnection system, between the patterned metal layers, metal features and vias; and
    forming a conductive liner, comprising material different from that of the metal features, directly on the metal features and vias, wherein the conductive liner substantially envelopes all the metal features and vias.

19. The method according to claim 18, further comprising:
    forming a dielectric sealing layer on the substrate; and
    forming the first patterned metal layer on the dielectric sealing layer.

20. The method according to claim 19, further comprising forming electric protective layers on the uppermost patterned metal layer.

21. The method according to claim 20, comprising:
    forming the inter-layer dielectrics by depositing layers of a: lead-rich glass soluble in acetic acid; benzocyclobutene resin; or silica at a temperature less than about 400° C.; and
    removing the inter-layer dielectrics.

22. The method according to claim 20, comprising forming the conductive liner by selectively depositing a metal on the metal features and vias.

23. The method according to claim 20, wherein the dielectric sealing layer comprises a silicon nitride, or composite of a hydrophobic material on silicon nitride, and the dielectric protective layers comprise a bottommost protective layer of an oxide.

24. The method according to claim 22, comprising electroplating or electroless plating tungsten (W), molybdenum (Mo), osmium (Os), iridium (Ir) or an alloy thereof to form the conductive liner.

25. The method according to claim 22, comprising pulse electroplating the metal to form the conductive liner.

26. The method according to claim 25, comprising pulse electroplating the metal in a plurality of stages with non-electroplating periods of sufficient duration to permit diffusion of the plating metal to the surfaces of the metal features and vias.

27. The method according to claim 26, comprising pulse electroplating the metal with non-electroplating periods of about 10 to about 60 seconds.

* * * * *